(12) United States Patent
Wakimoto et al.

(10) Patent No.: US 9,240,456 B2
(45) Date of Patent: Jan. 19, 2016

(54) METHOD FOR MANUFACTURING SEMICONDUCTOR DEVICE

(75) Inventors: Hiroki Wakimoto, Matsumoto (JP); Masaaki Ogino, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/233,147

(22) PCT Filed: Jul. 15, 2011

(86) PCT No.: PCT/JP2011/066262
§ 371 (c)(1),
(2), (4) Date: Feb. 11, 2014

(87) PCT Pub. No.: WO2013/011548
PCT Pub. Date: Jan. 24, 2013

(65) Prior Publication Data
US 2014/0162413 A1    Jun. 12, 2014

(51) Int. Cl.
*H01L 21/332* (2006.01)
*H01L 29/66* (2006.01)
*H01L 21/761* (2006.01)
*H01L 21/78* (2006.01)
*H01L 21/308* (2006.01)
*H01L 29/06* (2006.01)

(52) U.S. Cl.
CPC ...... *H01L 29/66325* (2013.01); *H01L 21/3083* (2013.01); *H01L 21/761* (2013.01); *H01L 21/78* (2013.01); *H01L 29/0646* (2013.01); *H01L 29/0661* (2013.01); *H01L 29/66333* (2013.01); *H01L 29/0619* (2013.01)

(58) Field of Classification Search
USPC .......... 438/135, 462, 140, 421; 257/168, 170
See application file for complete search history.

(56) References Cited

U.S. PATENT DOCUMENTS

2011/0108883 A1    5/2011    Tsukamoto et al.

FOREIGN PATENT DOCUMENTS

| JP | S49-14780 | B1 | 4/1974 |
| JP | S61-263227 | A | 11/1986 |
| JP | S63-266851 | A | 11/1988 |
| JP | H06-275713 | A | 9/1994 |
| JP | H07-221049 | A | 8/1995 |
| JP | 2001-185727 | A | 7/2001 |

(Continued)

OTHER PUBLICATIONS

JP 2001-185727 (English Translation attached).*

*Primary Examiner* — Errol Fernandes
(74) *Attorney, Agent, or Firm* — Rabin & Berdo, P.C.

(57) ABSTRACT

A method includes forming on a first main surface of a semiconductor wafer of a first conduction type, a gate electrode of a semiconductor element, an edge termination region for forming a breakdown voltage of the semiconductor element, and a first semiconductor region of a second conduction type which surrounds the semiconductor element and the edge termination region. A groove may be formed to reach the first semiconductor region from a second main surface of the semiconductor wafer. The groove is formed so that a portion of the semiconductor wafer, that forms an outer circumferential end of the semiconductor wafer, remains and the groove is further towards a center of the semiconductor wafer than the outer circumferential end. A third semiconductor region of the second conduction type is on a side wall of the groove and electrically connects the first semiconductor region and a second semiconductor region.

21 Claims, 12 Drawing Sheets

(56) References Cited

FOREIGN PATENT DOCUMENTS

| | | |
|---|---|---|
| JP | 3285146 B2 | 3/2002 |
| JP | 2002-231972 A | 8/2002 |
| JP | 2004-207553 A | 7/2004 |
| JP | 3556437 B2 | 8/2004 |
| JP | 2011-054844 A | 3/2011 |
| WO | WO-2009/139417 A1 | 11/2009 |

* cited by examiner

METHOD FOR MANUFACTURING SEMICONDUCTOR DEVICE

FIELD

The present invention relates to a method for manufacturing a semiconductor device.

BACKGROUND

An insulated gate bipolar transistor (IGBT) which is one of power semiconductor elements is a one-chip power element having the high-speed switching characteristics and voltage driving characteristics of a metal oxide semiconductor field effect transistor (MOSFET) and the low on-voltage characteristics of a bipolar transistor. The IGBT can be applied to an industrial field including general-purpose inverters, AC servo mechanisms, uninterruptible power supplies (UPS), or switching power supplies and a consumer equipment field including microwave ovens, rice cookers, or strobes.

In addition, a study has been made on a technique in which a bidirectional switching element is used as a matrix converter, such as a direct link conversion circuit, in order to perform AC (alternating current)/AC conversion to reduce the size, weight, and costs of a circuit and to increase the efficiency and response of the circuit. An IGBT with a reverse breakdown voltage (hereinafter, referred to as a reverse blocking IGBT) is needed in order to form the bidirectional switching element using the reverse parallel connection of the IGBTs with a reverse breakdown voltage. The structure of the reverse blocking IGBT will be described.

FIG. 11 is a cross-sectional view illustrating a main portion of the structure of the reverse blocking IGBT. FIG. 11 illustrates the cross-sectional structure of a reverse blocking IGBT 100 in the vicinity of an edge termination region 110. The reverse blocking IGBT 100 includes an active region (not illustrated), an edge termination region 110 for holding a breakdown voltage, and a separation structure portion 120 for holding a reverse breakdown voltage. The edge termination region 110 surrounds the active region and the separation structure portion 120 surrounds the edge termination region 110. In the active region, an emitter electrode (not illustrated) or a MOS gate structure of the IGBT is formed on a first main surface (front surface) of a semiconductor substrate 101 which will be an n-type drift region.

In the edge termination region 110, a p-type field limiting ring 111 and a p-type channel stopper 112 are formed in a surface layer of the first main surface of the semiconductor substrate 101. The p-type channel stopper 112 is formed on the element end side of the edge termination region 110. Conductive films 113 are connected respectively to the p-type field limiting ring 111 and the p-type channel stopper 112. The conductive films 113 are insulated from each other by an interlayer insulating film 114.

A p-type collector layer 102 is formed in a surface layer of the second main surface (rear surface) of the semiconductor substrate 101 so as to extend from the active region to the edge termination region 110. Then, the p-type collector layer 102 which is provided in the second main surface of the semiconductor substrate 101 and the p-type channel stopper 112 which is provided in the first main surface of the semiconductor substrate 101 need to be connected to each other in order to hold the reverse breakdown voltage of the reverse blocking IGBT 100. Therefore, a p-type separation region 121 which comes into contact with the p-type collector layer 102 and the p-type channel stopper 112 is formed in the separation structure portion 120 which is provided at the end of the element of the semiconductor substrate 101.

The p-type separation region 121 can be formed as a diffusion layer with a depth equal to the thickness of the semiconductor substrate 101 by, for example, deep diffusion from the first main surface to the second main surface of the semiconductor substrate 101. When the diffusion layer, which is the p-type separation region 121, is formed in this way, it is necessary to form the diffusion layer at a depth corresponding to the thickness of an n-type drift region for each breakdown voltage. Specifically, the depth of the diffusion layer, which is the p-type separation region 121, needs to be equal to or more than 120 μm in a reverse blocking IGBT with a breakdown voltage of 600 V and needs to be equal to or more than 200 μm in a reverse blocking IGBT with a breakdown voltage of 1200 V. Therefore, it is necessary to perform a heat treatment at a temperature of 1300° C. for 100 hours or more in order to form the diffusion layer at a depth of 120 μm or more, which is impractical.

In order to solve the above-mentioned problems, as illustrated in FIG. 11, the reverse blocking IGBT 100 has been known in which the p-type collector layer 102 and the p-type channel stopper 112 are connected to each other by the p-type separation region 121 which is formed with a thickness less than that of the semiconductor substrate 101 at a depth which reaches a groove 130 that is formed from the first main surface to the second main surface of the semiconductor substrate 101 and a p-type layer 131 which is formed in the side wall of the groove 130. As such, when the p-type layer 131 is formed in the side wall of the groove 130, the reverse blocking IGBT 100 can have the same reverse breakdown voltage as a reverse blocking IGBT including a deep diffusion layer which extends from the first main surface to the second main surface of the semiconductor substrate 101.

Specifically, for example, the reverse blocking IGBT 100 is manufactured (produced) as follows. First, the p-type separation region 121 is formed at a predetermined depth from the first main surface of the semiconductor substrate 101 so as not to reach the second main surface. Then, a front surface element structure including, for example, a MOS gate structure or an emitter electrode and a front surface element structure of the edge termination region 110 are formed on the first main surface of the semiconductor substrate 101. The p-type channel stopper 112 which is formed as the front surface element structure of the edge termination region 110 is formed so as to come into contact with the p-type separation region 121.

Then, the groove 130 is formed so as to reach the p-type separation region 121 from the second main surface of the semiconductor substrate 101. The groove 130 is formed so as to surround the edge termination region 110. Then, the p-type collector layer 102 is formed in the surface layer of the second main surface of the semiconductor substrate 101 and the p-type layer 131 is formed in the surface layer of the side wall of the groove 130 so as to come into contact with the p-type collector layer 102 and the p-type separation region 121. Then, a collector electrode (not illustrated) is formed so as to come into contact with the p-type collector layer 102 and the p-type layer 131.

The reverse blocking IGBT 100 is formed in each element formation region of a wafer. The groove 130 is formed on a dicing line which surrounds the element formation region of the wafer. Then, the wafer is diced along the groove 130 by a dicing blade with a width less than that of the bottom of the groove 130 in the lateral direction. A plurality of reverse blocking IGBTs 100 formed on the wafer are cut into chips. In this way, the reverse blocking IGBT 100 is completed.

As a method for manufacturing the reverse blocking IGBT, the following method has been proposed. A positive bevel structure is formed outside a planar edge termination region of the IGBT. A forward breakdown voltage is output by the planar edge termination region and a reverse breakdown voltage is output by the positive bevel structure. A p region is formed in a bevel surface (the end surface of a semiconductor substrate). In this way, a semiconductor device with a reverse breakdown voltage is obtained (for example, see the following Patent Literature 1).

Next, the arrangement of the grooves 130 in the wafer having the reverse blocking IGBT 100 formed thereon will be described. FIG. 12 is a diagram illustrating the state of a wafer while a semiconductor device according to the related art is being manufactured. The upper side of FIG. 12 shows the planar layout of the grooves 130 formed in a second main surface of a wafer 200 and the planar layout is represented by a dotted line. The central and lower sides of FIG. 12 show the cross-sectional structure of the wafer 200 taken along the line AA-AA' and the line BB-BB', respectively. The cross section taken along the line AA-AA' is a cross-sectional structure in which the grooves 130 are cut in the lateral direction such that a plurality of element formation regions 201 are traversed. The cross section taken along the line BB-BB' is a cross-sectional structure in which the groove 130 is cut in the longitudinal direction.

As illustrated in FIG. 12, the reverse blocking IGBT (not illustrated) is formed in each element formation region 201 of the wafer 200 and the grooves 130 are formed in a lattice in the second main surface of the wafer 200. The groove 130 is formed so as to reach the outer circumferential end (side surface) 202 of the wafer 200. Specifically, in the cross section of the wafer 200 taken along the line AA-AA', the grooves 130 are formed in the second main surface of the wafer 200 at regular intervals and are not formed at the outer circumferential ends 202-1a and 202-2a of the second main surface of the wafer 200.

On the other hand, in the cross section of the wafer 200 taken along the line BB-BB', the groove 130 is formed so as to extend from the outer circumferential end 202-1b to the other outer circumferential end 202-2b of the second main surface of the wafer 200 and penetrates the wafer 200 in the lateral direction (a direction perpendicular to the depth direction of the element). Therefore, in the cross section of the wafer 200 taken along the line BB-BB', the wafer 200 is uniformly thin.

As a method for manufacturing an element structure on a wafer, a method has been proposed which includes a step of applying a photoresist onto a semiconductor substrate on which an insulating film serving as an etching mask is deposited in a lithography process for defining an element region and a step of exposing an effective chip, exposing a circumferential portion of the wafer other than the effective chip as a dummy using the same reticle as that used for the effective chip, developing the exposed portions, performing a minimum number of exposure operations at which an etched area is equal to or more than 60% of the entire wafer to obtain an etched region (for example, see the following Patent Literature 2).

As another method, a method for manufacturing a semiconductor integrated circuit device has been proposed which processes a semiconductor wafer including a product chip region which is disposed in an effective processing region of a semiconductor wafer and in which a product chip forming the semiconductor integrated circuit device is formed and a pseudo-chip region which is disposed in an outer circumferential portion of the semiconductor wafer and in which an incomplete chip that does not become the product chip is formed. The manufacturing method includes a first step of forming a concave portion in which a conductive element forming member forming a semiconductor integrated circuit element is formed in an insulating film of the product chip region and forming a pseudo-concave portion with dimensions that are equal to or more than two times the pattern dimensions of the concave portion and are equal to or less than 1 mm in an insulating film of the peripheral chip region and a second step of depositing a conductive film on the surface of the insulating film including the inner surfaces of the concave portion and the pseudo-concave portion in the entire surface of the semiconductor wafer and polishing the surface of the conductive film using a CMP method to remove the conductive film on the surface of the insulating film, thereby forming a conductive element forming member on the inner surface of the concave portion and the inner surface of the pseudo-concave portion (for example, see the following Patent Literature 3).

As a method for forming the grooves in the wafer, a method has been proposed which partially forms a resist pattern in an ineffective pattern region of a circumferential portion of the water when a wiring pattern is formed using the resist pattern as a mask (for example, see the following Patent Literature 4).

CITATION LIST

Patent Literature

Patent Literature 1: JP-A-2001-185727
Patent Literature 2: Japanese Patent No. 3285146
Patent Literature 3: Japanese Patent No. 3556437
Patent Literature 4: JP-A-2004-207553

SUMMARY

Technical Problem

However, the inventors made a thorough study and found that the following problems newly occurred. When the groove 130 was formed so as to reach the outer circumferential end 202 of the wafer 200 as illustrated in the cross-sectional view of FIG. 12 taken along the line BB-BB', the wafer 200 was frequently broken during a wafer process or while it was transported or handled. It was confirmed that the breaking of the wafer 200 started from the groove 130 in the vicinity of the outer circumferential end 202 of the wafer 200. The broken wafer 200 cannot be placed on a manufacturing line during a wafer process. Therefore, the yield of the wafer 200 is reduced.

In order to solve the above-mentioned problems of the related art, an object of the invention is to provide a method for manufacturing a semiconductor device capable of reducing the breaking of the semiconductor wafer.

Solution to Problem

In order to solve the above-mentioned problems and achieve the object of the invention, a method for manufacturing a semiconductor device according to the invention has the following characteristics. First, a step of forming, on a first main surface of a semiconductor wafer of a first conduction type, a first electrode and a MOS gate structure, which is a gate electrode of a semiconductor element, an edge termination region for holding a breakdown voltage of the semiconductor element, and a first semiconductor region of a second conduction type which surrounds the semiconductor element and the edge termination region is performed. Then, a step of forming a groove that reaches the first semiconductor region from a second main surface of the semiconductor wafer is performed. Then, a step of forming a second semiconductor region of the second conduction type in the second main surface of the semiconductor wafer and forming a third semiconductor region of the second conduction type in a side wall of the groove so as to be electrically connected to the first semiconductor region and the second semiconductor region is performed. Then, a step of forming a second electrode that is electrically connected to the second semiconductor region is performed. In this case, in the step of forming the groove, a portion of the semiconductor wafer which has a predetermined width from an outer circumferential end of the semiconductor wafer remains and the groove is formed inside the outer circumferential end of the semiconductor wafer.

In the method for manufacturing a semiconductor device according to the invention, in the step of forming the groove, the groove may be formed such that a distance from the side wall of the groove to the outer circumferential end of the semiconductor wafer is equal to or more than 7 mm.

In the method for manufacturing a semiconductor device according to the invention, the groove may have a trapezoidal shape or a arc shape in a cross-sectional view.

In the method for manufacturing a semiconductor device according to the invention, in the step of forming the groove, the groove may be formed such that the thickness of a portion of the semiconductor wafer corresponding to the bottom of the groove is partially large.

In the method for manufacturing a semiconductor device according to the invention, in the step of forming the groove, the groove may be formed so as to surround the semiconductor element and the edge termination region.

According to the above-mentioned structure of the invention, when the grooves are formed in the wafer so as to surround the semiconductor element and the edge termination region formed on the wafer, they are formed such that the end of the groove in the longitudinal direction does not reach the outer circumferential end of the wafer. Therefore, it is possible to reduce the breaking of the wafer during a wafer process or when the wafer is transported or handled.

Advantageous Effects of Invention

According to the method for manufacturing the semiconductor device of the invention, it is possible to reduce the breaking of the semiconductor wafer.

DESCRIPTION OF EMBODIMENTS

Figure 1:
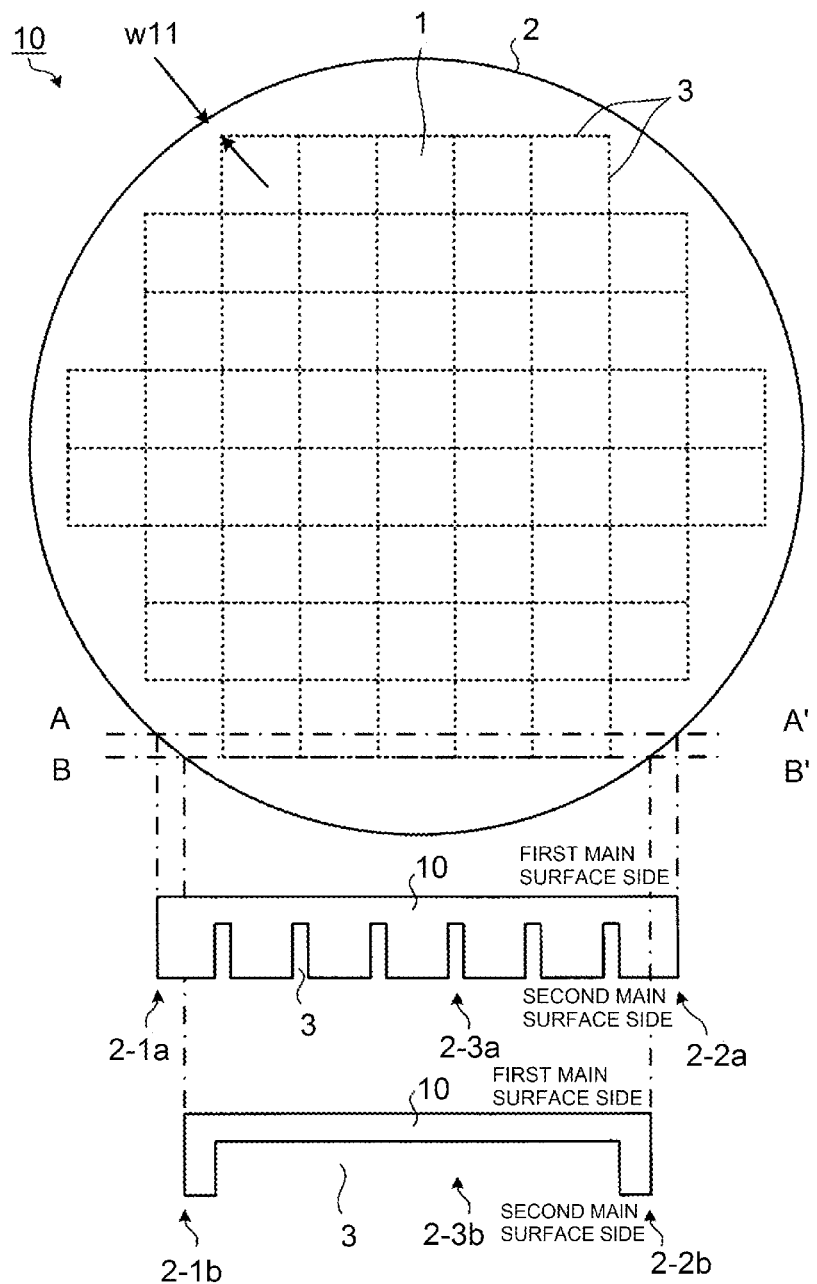
FIG. 1 is a diagram illustrating the state of a wafer while a semiconductor device according to Embodiment 1 is being manufactured.

Hereinafter, semiconductor devices according to exemplary embodiments of the invention will be described in detail with reference to the accompanying drawings. In the specification and the accompanying drawings, in the layers or regions having "n" or "p" appended thereto, an electron or a hole means a majority carrier, respectively. In addition, symbols "+" and "−" added to n or p mean that impurity concentration is higher and lower than that of the layer or the region without the symbols, respectively. In the description of the following embodiments and the accompanying drawings, the same components are denoted by the same reference numerals and the description thereof will not be repeated.

Embodiment 1

Figure 2:
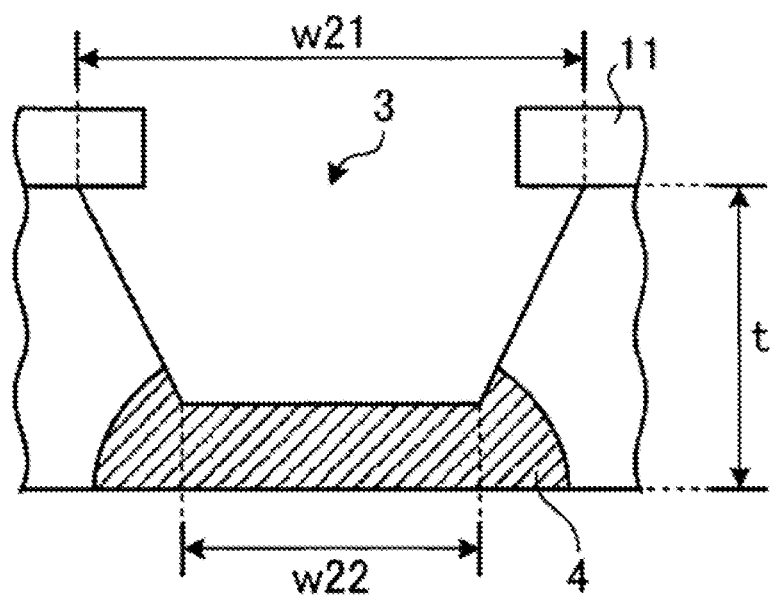
FIG. 2 is a cross-sectional view illustrating the cross-sectional shape of a groove according to Embodiment 1.

FIG. 1 is a diagram illustrating the state of a wafer while a semiconductor device according to Embodiment 1 is being manufactured. The upper side of FIG. 1 is a plan view illustrating a wafer 10 having semiconductor devices formed thereon. In FIG. 1, the cross section of the wafer 10 taken along the line A-A' is a cross-sectional structure in which grooves 3 are cut in the lateral direction such that a plurality of element formation regions 1 are traversed (the central cross-sectional view of FIG. 1). The cross section of the wafer 10 taken along the line B-B' is a cross-sectional structure in which the groove 3 is cut in the longitudinal direction (the lower cross-sectional view of FIG. 1). FIG. 2 is a cross-sectional view illustrating the cross-sectional shape of the groove according to Embodiment 1.

Figure 11:
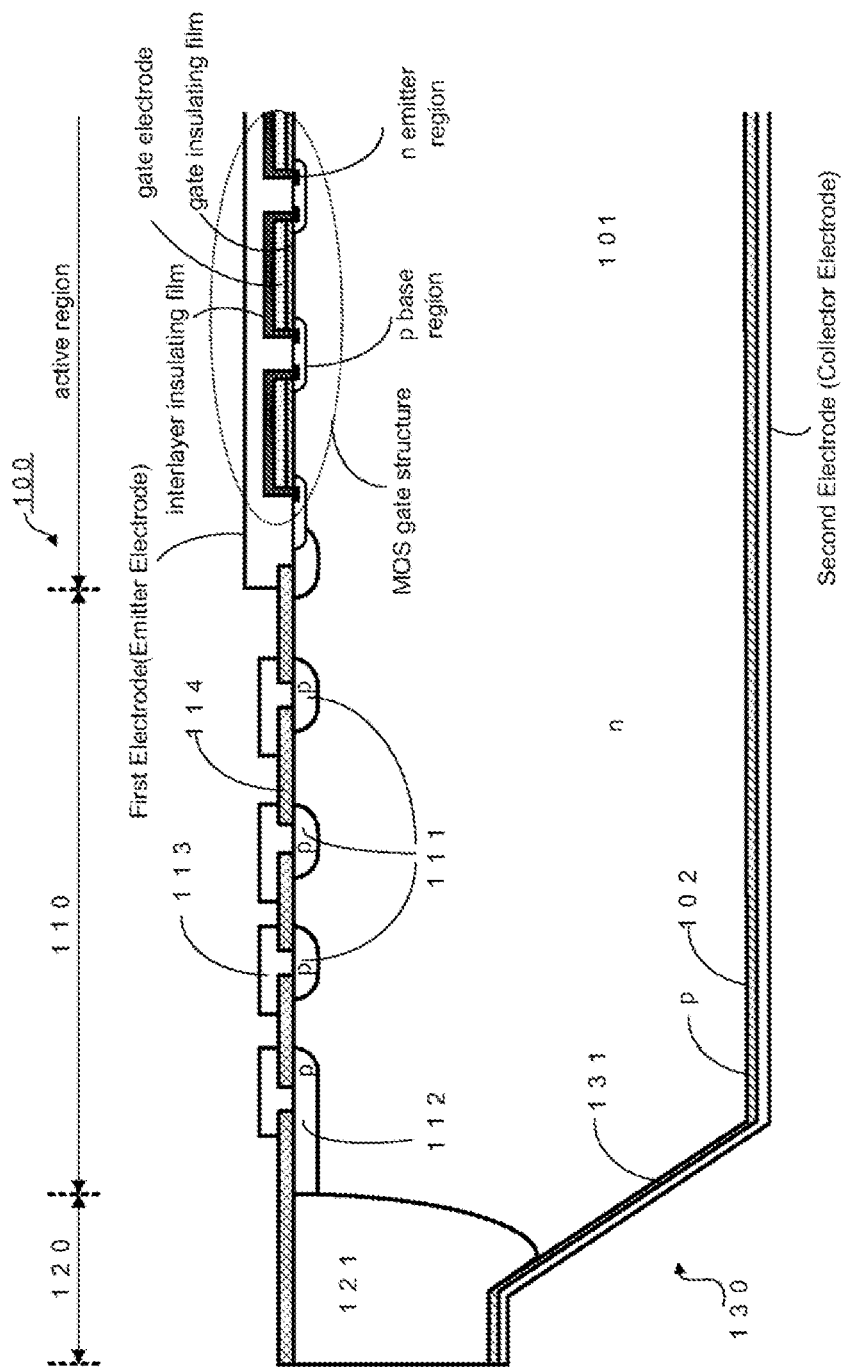
FIG. 11 is a cross-sectional view illustrating a main portion of the structure of a reverse blocking IGBT.
Figure 12:
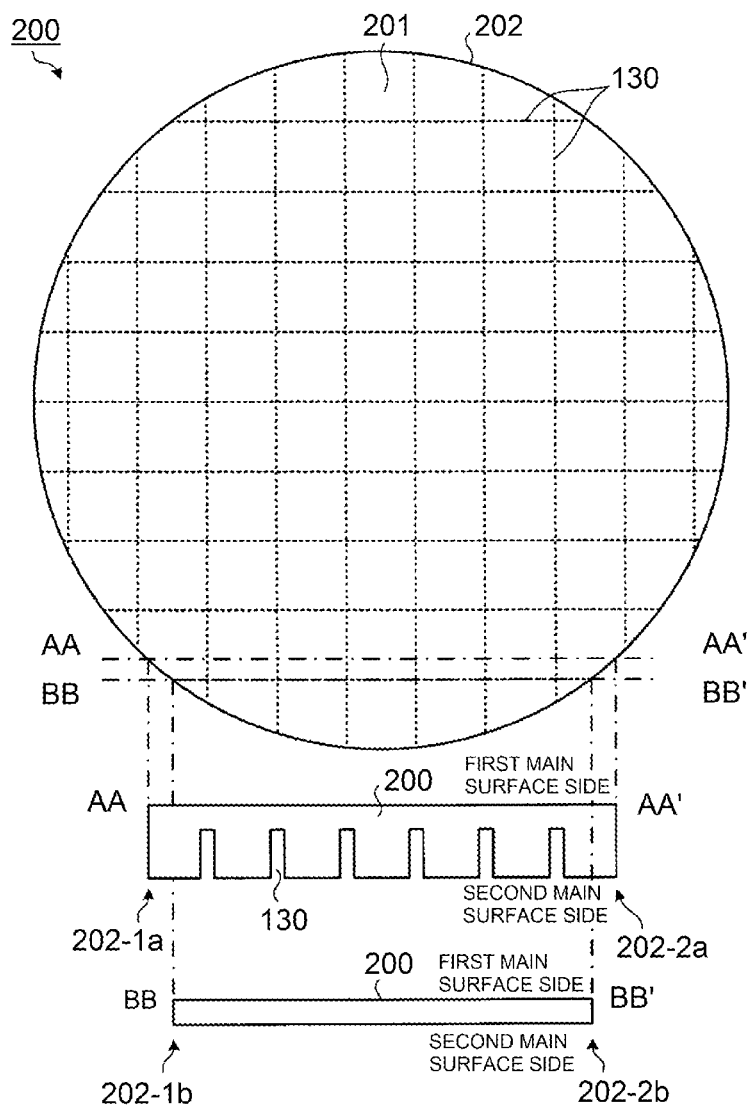
FIG. 12 is a diagram illustrating the state of a wafer while a semiconductor device according to the related art is being manufactured.

As illustrated in FIG. 1, the element structure (not illustrated) of the semiconductor device is formed in each element formation region 1 of the wafer 10. The semiconductor device formed on the wafer 10 is, for example, an IGBT (reverse blocking IGBT) with a reverse breakdown voltage (see FIG. 11). The reverse blocking IGBT includes an active region in which a current flows when the IGBT is turned on, an edge termination region for holding a breakdown voltage, and a separation structure portion for holding a reverse breakdown voltage. That is, the active region, the edge termination region, and the separation structure portion are formed in each element formation region 1.

In the active region of each element formation region 1, a front surface element structure of the IGBT which includes, for example, an emitter electrode (first electrode) and a MOS gate structure including a base region, an emitter region, a gate insulating film, and a gate electrode is formed on the first main surface (front surface) of the n-type wafer 10 which will be an n-type drift region.

The edge termination region is formed so as to surround the active region. In the edge termination region of each element formation region 1, a front surface element structure of the edge termination region including, for example, a p-type field limiting ring and a p-type channel stopper is formed in a surface layer of the first main surface of the wafer 10. The p-type channel stopper is separated from the p-type field limiting ring and is formed on the element end side of the edge termination region. Conductive films are connected to the p-type field limiting ring and the p-type channel stopper. The conductive films are insulated from each other by the interlayer insulating film.

The separation structure portion is formed on the element end side of each element formation region 1 so as to surround the edge termination region. In the separation structure portion of each element formation region 1, a p-type separation region (first semiconductor region) for holding the reverse breakdown voltage of the reverse blocking IGBT is formed in the surface layer of the first main surface of the wafer 10 at a predetermined depth which does not reach the second main surface of the wafer 10. The p-type separation region is formed by, for example, ion implantation and diffusion using a heat treatment. In addition, the p-type separation region is formed so as to come into contact with the p-type channel stopper.

As described above, after the front surface element structure of the reverse blocking IGBT, the front surface element structure of the edge termination region, and the separation structure portion are formed on the first main surface, the wafer 10 is thinned from the second main surface (rear surface). The groove 3 is formed in the second main surface of the thinned wafer 10 so as to reach the p-type separation region. The groove 3 is formed so as not to reach the outer circumferential end (side surface) 2 of the second main surface of the wafer 10. That is, the groove 3 is formed so as not to penetrate the wafer in the lateral direction (a direction perpendicular to the depth direction of the element). In addition, the groove 3 is formed on, for example, a dicing line which surrounds the element formation region 1 of the wafer 10 so as to surround the active region and the edge termination region.

Specifically, the groove 3 is formed by, for example, wet etching or dry etching using a resist mask formed on the second main surface of the wafer 10 as a mask. In addition, the groove 3 is formed inside the outer circumferential end of the wafer 10 such that a portion of the wafer 10 with a predetermined width from the outer circumferential end 2 of the wafer 10 remains. That is, the groove 3 is formed such that the end of the groove 3 in the longitudinal direction does not reach the outer circumferential ends 2-1*a*, 2-2*a*, 2-1*b*, and 2-2*b* of the wafer 10. When the groove 3 is formed in this way, it is possible to reduce the breaking of the wafer 10 when the wafer 10 is diced.

Preferably, the width of the remaining portion of the wafer 10 from the outer circumferential end 2, that is, a distance (hereinafter, referred to as the shortest distance between the groove and the outer circumferential end of the wafer) w11 from the outer circumferential end 2 of the wafer 10 to the upper end of the side wall of the groove 3 which is closest to the outer circumferential end 2 of the wafer 10 is equal to or more than 5 mm in a reverse blocking IGBT with a breakdown voltage class of 1200 V and is equal to or more than 7 mm in a reverse blocking IGBT with a breakdown voltage class of 1700 V. When the shortest distance w11 between the groove and the outer circumferential end of the wafer is too long, the number of chips cut out from one wafer 10 is reduced and costs increase. Therefore, it is preferable to appropriately adjust the shortest distance w11 between the groove and the outer circumferential end of the wafer in accordance with the structure or a breakdown voltage class of the reverse blocking IGBT.

The thickness of the thinned wafer 10 may be, for example, about 190 μm in the reverse blocking IGBT with a breakdown voltage class of 1200 V and may be, for example, about 270 μm in the reverse blocking IGBT with a breakdown voltage class of 1700 V. The depth t of the groove 3 may be equal to or less than 85 μm in the reverse blocking IGBT with a breakdown voltage class of 1200 V and may be equal to or less than 175 μm in the reverse blocking IGBT with a breakdown voltage class of 1700 V. A method for forming the groove 3 will be described below. The cross-sectional shape of the wafer 10 having the groove 3 formed therein will be described below.

After the resist mask for forming the groove 3 is removed, a p-type collector layer (a second semiconductor region: not illustrated) of the reverse blocking IGBT is formed in the surface layer of the second main surface of the wafer 10 so as to extend from the active region to the edge termination region. Then, a p-type layer (third semiconductor region) is formed in a surface layer of the side wall of the groove 3 so as to come into contact with the p-type collector layer and the p-type separation region. That is, the p-type collector layer and the p-type channel stopper are connected to each other by the p-type separation region which is formed at a predetermined depth from the first main surface of the wafer 10 and the p-type layer which is formed in the side wall of the groove 3. For example, the p-type layer and the p-type collector layer are formed at the same time.

A collector electrode (second electrode) is formed on the second main surface of the wafer 10 so as to come into contact with the p-type collector layer and the p-type layer. The collector electrode is formed by a physical vapor deposition method, such as a chemical vapor deposition method or a sputtering method. In this way, as represented by a dotted line in the upper plan view of FIG. 1, the grooves 3 are formed in a lattice in the second main surface of the wafer 10 so as not to reach the outer circumferential end 2 of the wafer 10. Then, the wafer 10 is diced into chips along the dicing lines by a dicing blade with a width that is less than the width of the bottom of the groove 3 in the lateral direction. In this way, the reverse blocking IGBTs formed in each element formation region 1 of the wafer 10 are cut into individual chips. Therefore, the reverse blocking IGBT is completed.

Next, a method for forming the groove 3 using, for example, wet etching will be described. First, the first main surface of the wafer 10 on which the front surface element structure of the reverse blocking IGBT (including the front surface element structure of the edge termination region and the p-type separation region of the separation structure portion) is formed is protected by a protective resist. Then, a tape is attached to the surface of the protective resist. The front surface element structure of the reverse blocking IGBT, the front surface element structure of the edge termination region, and the p-type separation region of the separation structure portion may be formed by, for example, the same method as that according to the related art. Then, the wafer 10 is fixed to, for example, a stage, with the first main surface of the wafer 10, to which the tape is attached, down.

Then, for example, grinding or etching is performed to uniformly remove the wafer 10 from the second main surface of the wafer 10, thereby thinning the wafer 10. When the protective resist is formed on the first main surface of the wafer 10, it is also formed from the first main surface to the side surface and the second main surface of the wafer 10. However, the protective resist formed on the rear surface of the wafer 10 is removed by thinning the wafer 10 from the second main surface. After the wafer 10 is thinned, the tape peels off from the first main surface of the wafer 10.

Then, a resist mask in which a region for forming the groove 3 is opened is formed on the second main surface of the wafer 10 by photolithography. The opening portions of the resist mask are not formed in a portion corresponding to the region, which extends at least the shortest distance w11 between the groove and the outer circumferential end of the wafer from the outer circumferential end 2 of the wafer 10 to the inside of the wafer 10, in the resist applied onto the second main surface of the wafer 10. Then, the entire wafer 10 is immersed into an alkali solution and wet etching is performed to remove a portion of the wafer 10 which is exposed from the opening portions of the resist mask. In this way, the grooves 3 are formed in the second main surface of the wafer 10. The groove 3 is formed at the depth t which reaches the p separation region formed in the first main surface of the wafer 10.

The resist mask for forming the grooves 3 may be formed by exposing the pattern of the grooves 3 to the resist and developing the resist. Specifically, for example, the resist applied onto the second main surface of the wafer 10 is exposed by a stepper. In this case, the exposure conditions are set such that the pattern of the grooves 3 is not exposed to the portion corresponding to the region, which extends at least the shortest distance w11 between the groove and the outer circumferential end of the wafer from the outer circumferential end 2 of the wafer 10 to the inside of the wafer 10, in the resist applied onto the second main surface of the wafer 10.

Next, the cross-sectional shape of the wafer 10 having the grooves 3 formed therein will be described. As illustrated in the plan view of the wafer 10 which is on the upper side of FIG. 1, the grooves 3 are arranged in a lattice in a plan view such that they do not reach the outer circumferential end 2 of the wafer 10. Therefore, as illustrated in the central and lower cross-sectional views of the wafer 10 in FIG. 1 taken along the line A-A' and the line B-B', the thickness of the outer circumferential ends 2-1a, 2-2a, 2-1b, and 2-2b of the wafer 10 is more than that of the central portions 2-3a and 2-3b of the wafer 10 in which the grooves 3 are formed. In the cross-sectional views of the wafer 10 in FIG. 1 taken along the line A-A' and the line B-B', the side wall of the groove 3 is vertical to the first main surface of the wafer 10. However, as illustrated in FIG. 2 which will be described below, the side wall of the groove 3 is inclined with respect to the first main surface of the wafer 10.

Specifically, in the cross-sectional view of the wafer 10 taken along the line A-A', the grooves 3 are formed in the second main surface of the wafer 10 at regular intervals and are not formed at the outer circumferential ends 2-1a and 2-2a of the second main surface of the wafer 10. Therefore, the cross-sectional shape of the wafer 10 taken along the line A-A' is an uneven shape due to the grooves 3 formed in the second main surface. The element structures (not illustrated) of the reverse blocking IGBT and the edge termination region are formed in a portion interposed between adjacent grooves 3 in the wafer 10.

In the cross-sectional view of the wafer 10 taken along the line B-B', the thickness of the wafer 10 at the outer circumferential ends 2-1b and 2-2b of the wafer 10 is maintained to form the groove 3. Specifically, the groove 3 is not formed so as to extend from the outer circumferential end 2-1b to the other outer circumferential end 2-2b of the second main surface of the wafer 10 and does not penetrate the wafer 10 in the lateral direction. Therefore, the cross-sectional shape of the wafer 10 taken along the line B-B' is a concave shape in which the thickness of the central portion 2-3b is constantly small and the thickness of the outer circumferential ends 2-1b and 2-2b is large.

Next, the cross-sectional shape of the groove 3 formed in the wafer 10 will be described. As illustrated in FIG. 2, the groove 3 has a trapezoidal shape in a cross-sectional view in which the first width w21 of an opening portion of the groove 3 in the lateral direction is more than the second width w22 of the bottom of the groove 3 in the lateral direction. The groove 3 is preferably formed such that the (110) plane is exposed to the side wall of the groove 3. The reason is that, since the side wall of the groove 3 can be flat, the diffusion depth of the p-type layer provided in the side wall of the groove 3 can be uniform. The groove 3 having the trapezoidal shape in a cross-sectional view is formed by, for example, wet etching.

Specifically, the groove 3 is formed at the depth which reaches a p-type separation region 4 by anisotropic etching, using a resist mask 11 as a mask. The angle θ between an expansion line of the bottom of the groove 3 and the side wall of the groove 3 is an acute angle by the anisotropic etching and the groove 3 with a trapezoidal shape in a cross-sectional shape is formed. The first width w21 may be, for example, about 250 μm. The second width w22 may be, for example, about 100 μm.

The cross-sectional shape of the groove 3 may be a substantially rectangular shape (not illustrated). The groove 3 with a substantially rectangular shape in a cross-sectional view is formed by, for example, dry etching. Specifically, the groove 3 is formed at a depth which reaches the p-type separation region by anisotropic etching using a resist mask as a mask. When the groove 3 is formed by anisotropic etching, the angle θ between an expansion line of the bottom of the groove 3 and the side wall of the groove 3 is about 90° and the groove 3 with a substantially rectangular shape in a cross-sectional shape is formed.

As described above, according to the method for manufacturing the semiconductor device according to Embodiment 1, when the groove 3 is formed in the separation structure portion of the element formation region 1 of the wafer 10, the groove 3 is formed such that the end of the groove 3 in the longitudinal direction does not reach the outer circumferential end of the wafer 10. Therefore, during a wafer process or when the wafer is transported or handled, it is possible to reduce the breaking of the wafer 10. As a result, it is possible to improve the yield of the wafer 10, as compared to a reverse blocking IGBT including a deep diffusion layer which extends from the first main surface to the second main surface of the wafer 10.

In addition, the method for manufacturing the semiconductor device according to Embodiment 1 can be applied to a method for manufacturing a reverse blocking IGBT in which a p-type collector layer and a p-type separation region formed in the first main surface of the wafer 10 are electrically connected to each other by the p-type layer. Therefore, it is possible to manufacture a reverse blocking IGBT having the same reverse breakdown voltage as the reverse blocking IGBT including a deep diffusion layer that extends from the first main surface to the second main surface of the wafer 10 with high yield, without performing a heat treatment at a temperature of 1300° C. for 100 hours or more in order to form the p-type separation region.

Embodiment 2

Figure 3:
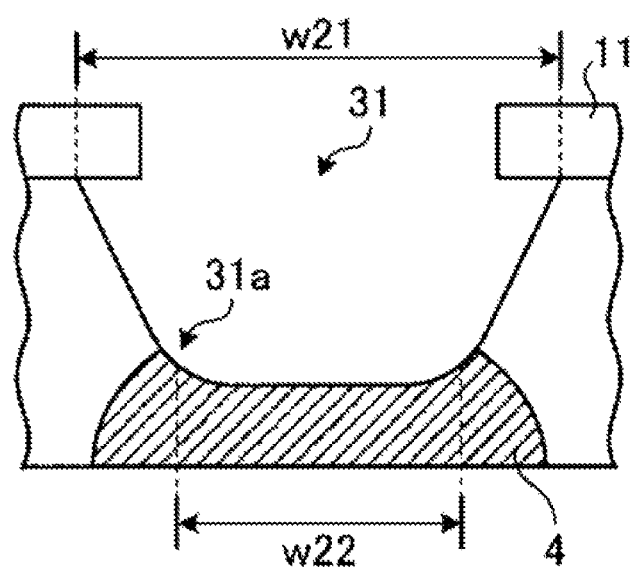
FIG. 3 is a cross-sectional view illustrating the cross-sectional shape of a groove according to Embodiment 2.

FIG. 3 is a cross-sectional view illustrating the cross-sectional shape of a groove according to Embodiment 2. A method for manufacturing a semiconductor device according to Embodiment 2 differs from the method for manufacturing the semiconductor device according to Embodiment 1 in that a groove 31 in which a bottom corner 31a has an arc shape is formed as the groove formed in the separation structure portion of the element formation region 1 of the wafer 10, as illustrated in FIG. 3. The groove 31 is formed by changing the shape of the bottom corner of the groove which is formed in the separation structure portion of the element formation region 1 of the wafer 10 into, for example, a arc shape.

Specifically, first, similarly to Embodiment 1, for example, wet etching is performed using a resist mask 11 as a mask to form grooves which reach a p-type separation region 4 formed in the separation structure portion of the element formation region 1 in the second main surface of the wafer 10. Then, for example, a laser beam is radiated to the bottom corner of the groove to change the shape of the bottom corner into a arc shape. In this way, the groove 31 with the arc-shaped bottom corner 31a is formed. In addition, a groove 31 with, for example, a U-shape in a cross-sectional view in which the bottom of the groove 31 has an arc shape, in addition to the bottom corner 31a of the groove 31, may be formed.

As another example of the method for forming the groove 31, etching may be performed two times and the shape of the bottom corner of the groove may be changed into a arc shape by the second etching. Specifically, first, similarly to Embodiment 1, wet etching is performed (first etching) to form grooves which reach the p-type separation region 4 in the second main surface of the wafer 10. Then, the resist mask 11 is removed. Then, isotropic etching, such as dry etching, is performed (second etching) to change the shape of the bottom corner of the groove into a arc shape. As such, since dry etching is performed as the second etching, an overhang which is formed at the upper end of the side wall of the groove so as to protrude into the groove during the first etching can be removed by the second etching.

The dimensions of the groove 31 are the same as those of, for example, the groove according to Embodiment 1. The structure of the reverse blocking IGBT formed on the wafer 10 is the same as that of the reverse blocking IGBT formed on the wafer according to Embodiment 1 except for the groove 31. The method for manufacturing the reverse blocking IGBT according to Embodiment 2 is the same as the method for manufacturing the reverse blocking IGBT according to Embodiment 1 except for a method for forming the groove 31.

As described above, according to Embodiment 2, it is possible to obtain the same effect as that in the method for manufacturing the semiconductor device according to Embodiment 1. In addition, since the bottom corner 31a of the groove 31 of the wafer 10 has an arc shape, it is possible to further reduce stress applied to the bottom corner 31a of the groove 31 of the wafer 10 during the wafer process of the wafer 10 and when the wafer is transported or handled. Therefore, it is possible to further reduce the breaking of the wafer 10.

Embodiment 3

Figure 4:
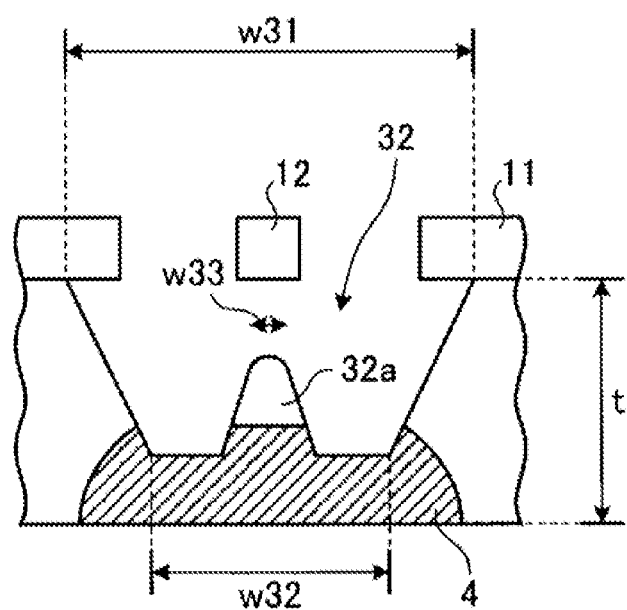
FIG. 4 is a cross-sectional view illustrating the cross-sectional shape of a groove according to Embodiment 3.

FIG. 4 is a cross-sectional view illustrating the cross-sectional shape of a groove according to Embodiment 3. A method for manufacturing a semiconductor device according to Embodiment 3 differs from the method for manufacturing the semiconductor device according to Embodiment 1 in that a groove 32 is formed such that the thickness of a portion of a wafer 10 corresponding to the bottom of the groove which is formed in a separation structure portion of an element formation region 1 of the wafer 10 is partially large, as illustrated in FIG. 4. For example, the groove 32 is formed as follows. Two grooves are formed between adjacent element formation regions 1 in the lateral direction of a region for forming the groove 32 and a protruding portion formed between the two grooves reduces in height up to a predetermined level.

Figure 5:
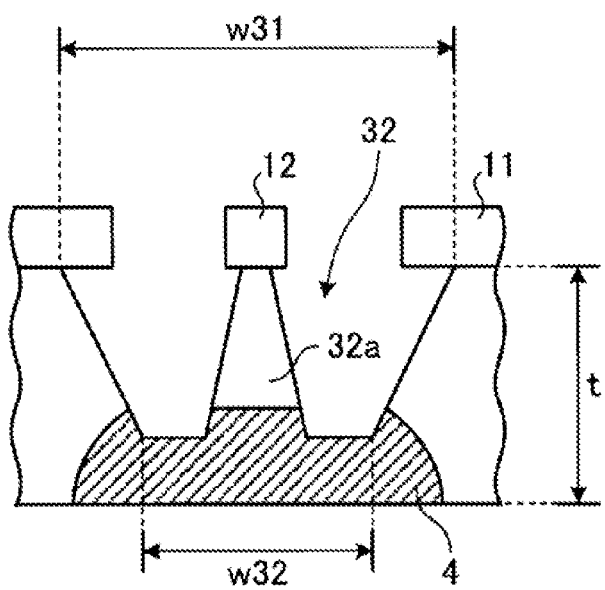
FIG. 5 is a cross-sectional view illustrating the state of the groove while a semiconductor device according to Embodiment 3 is being manufactured.
Figure 6:
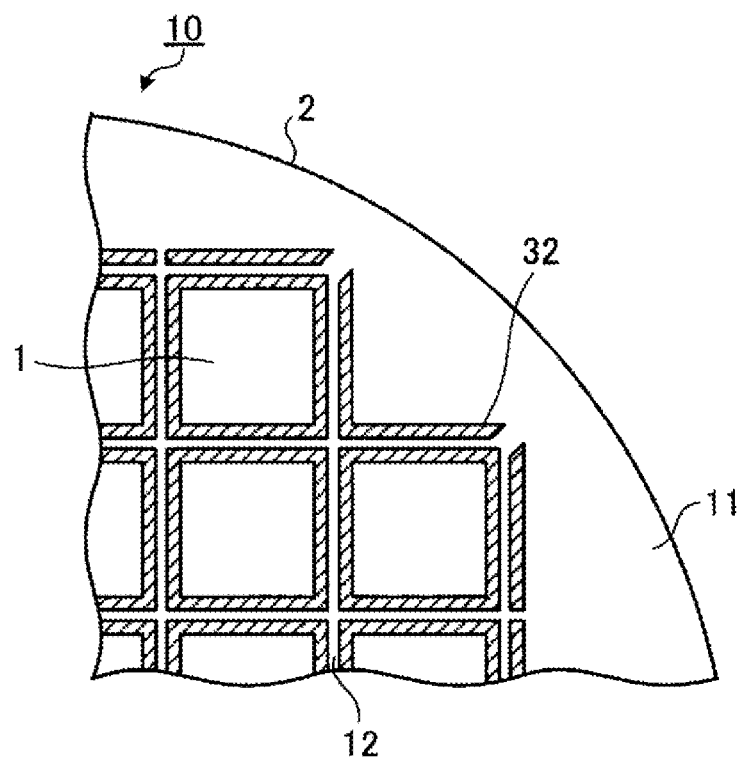
FIG. 6 is a plan view illustrating the state of a wafer while the semiconductor device according to Embodiment 3 is being manufactured.

Specifically, for example, the groove 32 is formed as follows. FIG. 5 is a cross-sectional view illustrating the state of the groove while the semiconductor device according to Embodiment 3 is being manufactured. FIG. 6 is a plan view illustrating the state of the wafer while the semiconductor device according to Embodiment 3 is being manufactured. First, as illustrated in FIG. 5, for example, a first resist mask 11 in which a region for forming the groove 32 is opened is formed on the first main surface of the wafer 10 and a second resist mask 12 which covers only the upper side of a dicing line (not illustrated) provided, for example, at the center of the region for forming the groove 32 is also formed on the first main surface of the wafer 10.

Then, for example, wet etching is performed using the first and second resist masks 11 and 12 as a mask to remove a portion of the wafer 10 which is exposed from the opening portions of the first and second resist masks 11 and 12, thereby forming the grooves 32 which reach a p-type separation region 4 in the second main surface of the wafer 10. In this case, the second resist mask 12 which covers the center of the region for forming the groove 32 causes an etching speed for removing a portion of the wafer 10 below the second resist mask 12 to be less than an etching speed for removing a portion of the wafer 10 which is exposed from the opening portions of the first and second resist masks 11 and 12. Therefore, as illustrated in FIG. 5, the groove 32 is formed in which two grooves are separated by a protruding portion 32a that corresponds to the second resist mask 12 and protrudes from the bottom of the groove 32.

Then, wet etching is continuously performed to reduce the height of the protruding portion 32a which protrudes from the bottom of the groove 32 and a gap is formed between the upper end of the protruding portion 32a and the second resist mask 12. In this way, as illustrated in FIG. 4, the two grooves are connected to each other by a space above the protruding portion 32a and the groove 32 with a cross-sectional shape in which the bottom partially protrudes due to the protruding portion 32a is formed. The first width w31 of the opening portion of the groove 32 in the lateral direction may be, for example, 155 μm. The second width w32 of the bottom of the groove 32 in the lateral direction may be, for example, 100 μm.

It is preferable that the third width w33 of the protruding portion 32a, which remains on the bottom of the groove 32 after the etching ends, in the lateral direction be enough for the protruding portion 32a to be removed by a dicing blade when the wafer 10 is diced. This is because the bottom of the groove 32 formed at the element end of the reverse blocking IGBT which has been diced into a chip can be flat. The third width w33 of the protruding portion 32a, which remains on the bottom of the groove 32 after the etching ends, in the lateral direction may be, for example, in the range of 20 μm to 30 μm.

As illustrated in FIG. 6, the first and second resist masks 11 and 12 for forming the groove 32 may be connected to each other at an arbitrary position, such as the end of the groove 32 in the longitudinal direction. When the first and second resist masks 11 and 12 are connected to each other, it is possible to prevent the second resist mask 12 from drifting in an etching bath during the etching of the wafer 10. Therefore, it is possible to prevent the second resist mask 12 which drifts in the etching bath from being reattached to the wafer 10. In addition, it is possible to prevent the deterioration of the etching bath due to the second resist mask 12 which drifts in the etching bath.

The structure of the reverse blocking IGBT formed on the wafer 10 is the same as that of the reverse blocking IGBT formed on the wafer according to Embodiment 1 except for the groove 32. The method for forming the reverse blocking IGBT according to Embodiment 3 is the same as the method for manufacturing the reverse blocking IGBT according to Embodiment 1 except for a method for forming the groove 32.

As described above, according to Embodiment 3, it is possible to obtain the same effect as that in the method for manufacturing the semiconductor device according to Embodiment 1. In addition, a portion of the wafer 10 corresponding to the bottom of the groove 32 which is likely to be broken can be formed with a larger thickness than that in the related art. Therefore, it is possible to further reduce the breaking of the wafer 10 during a wafer process or when the wafer is transported or handled.

Embodiment 4

Figure 7:
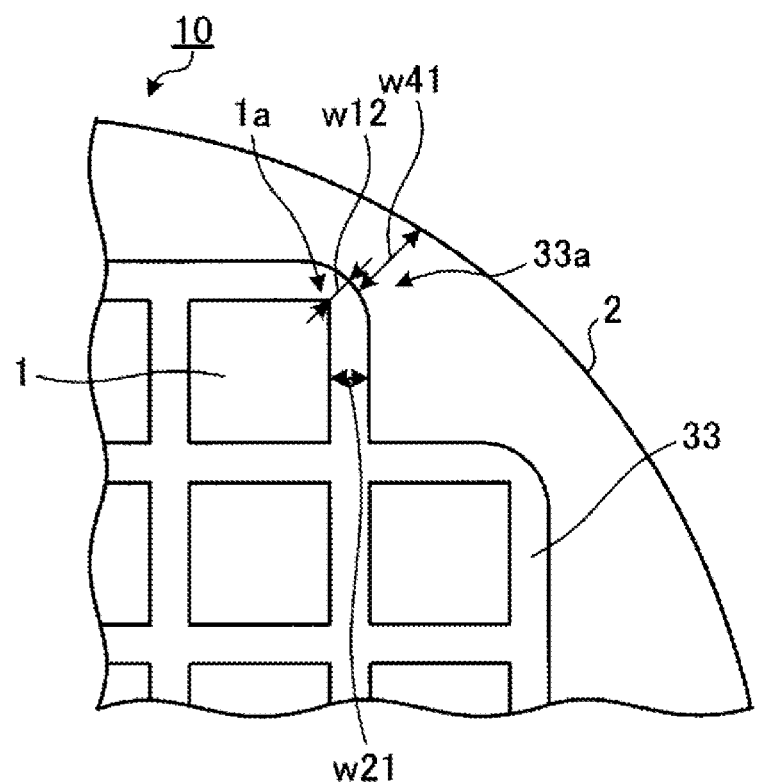
FIG. 7 is a plan view illustrating the planar shape of a groove according to Embodiment 4.

FIG. 7 is a plan view illustrating the planar shape of a groove according to Embodiment 4. A method for manufacturing a semiconductor device according to Embodiment 4 differs from the method for manufacturing the semiconductor device according to Embodiment 1 in that the fourth width w12 of an opening portion of a groove 33 from a corner 1a of an element formation region 1 closest to an outer circumferential end 2 of a wafer 10 to a side wall corner 33a of the groove 33 facing the corner 1a is less than the first width w21 of another opening portion of the groove 33, as illustrated in FIG. 7. Specifically, for example, the side wall corner 33a of the groove 33 closest to the outer circumferential end 2 of the wafer 10 has an arc shape in a plan view.

Figure 8:
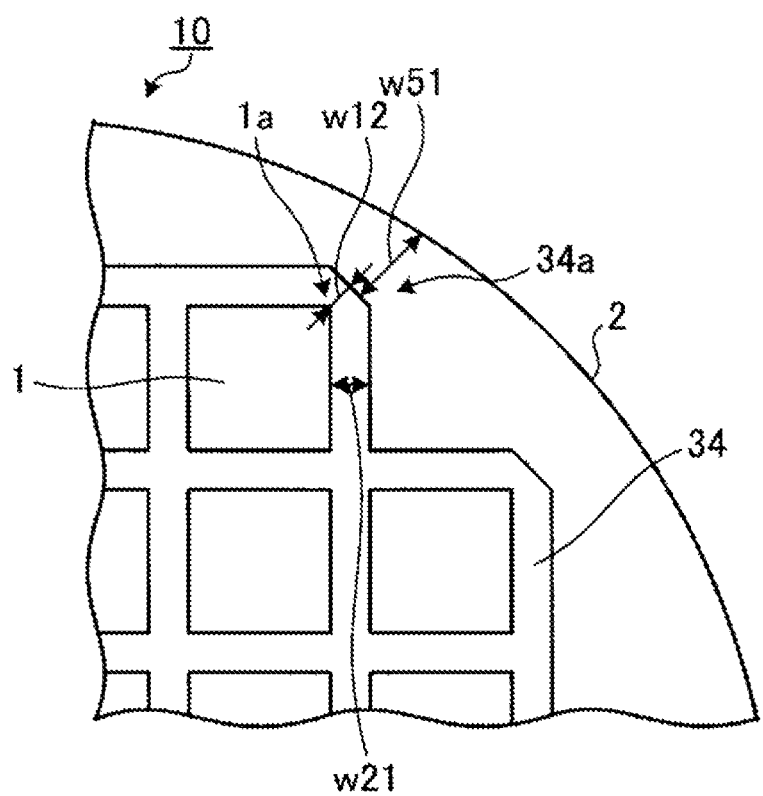
FIG. 8 is a plan view illustrating another example of the planar shape of the groove according to Embodiment 4.

A modification of the groove 33 illustrated in FIG. 7 will be described. FIG. 8 is a plan view illustrating another example of the planar shape of the groove according to Embodiment 4. As illustrated in FIG. 8, a groove 34 closest to the outer circumferential end 2 of the wafer 10 may have a planar shape in which a side wall corner 34a is chamfered such that the fourth width w12 of the groove 33 is less than the first width w21.

For example, the grooves 33 and 34 are formed by appropriately setting the pattern of a portion, which corresponds to the fourth width w12 of the groove 33, in a resist mask for forming the grooves 33 and 34 and performing wet etching using the resist mask as a mask. When the grooves 33 and 34 are formed, it is preferable that the planar shape of the side wall corners 33a and 34a of the grooves 33 and 34 be appropriately set such that the side wall corners 33a and 34a of the grooves 33 and 34 do not remain at the element end of the reverse blocking IGBT after the wafer 10 is diced. The reason is as follows. When the side wall corners 33a and 34a of the grooves 33 and 34 remain and the grooves 33 and 34 of the reverse blocking IGBT having a chip shape are filled with solder, the solder has an adverse effect on the electrical characteristics of the reverse blocking IGBT.

For example, the dimensions of the grooves 33 and 34 are the same as those of the groove according to Embodiment 1 except for the side wall corners 33a and 34a. The structure of the reverse blocking IGBT formed on the wafer 10 is the same as that of the reverse blocking IGBT formed on the wafer according to Embodiment 1 except for the grooves 33 and 34. The method for manufacturing the reverse blocking IGBT according to Embodiment 4 is the same as the method for manufacturing the reverse blocking IGBT according to Embodiment 1 except for a method for forming the grooves 33 and 34.

As described above, according to Embodiment 4, it is possible to obtain the same effect as that in the method for manufacturing the semiconductor device according to Embodiment 1. In addition, since the fourth width w12 is set as described above, it is possible to increase the shortest distances w41 and w51 between the groove and the outer circumferential end of the wafer. Therefore, it is possible to increase the number of element formation regions 1 arranged in one wafer 10. As a result, it is possible to increase the number of chips cut out from one wafer 10.

EXAMPLE 1

Figure 9:
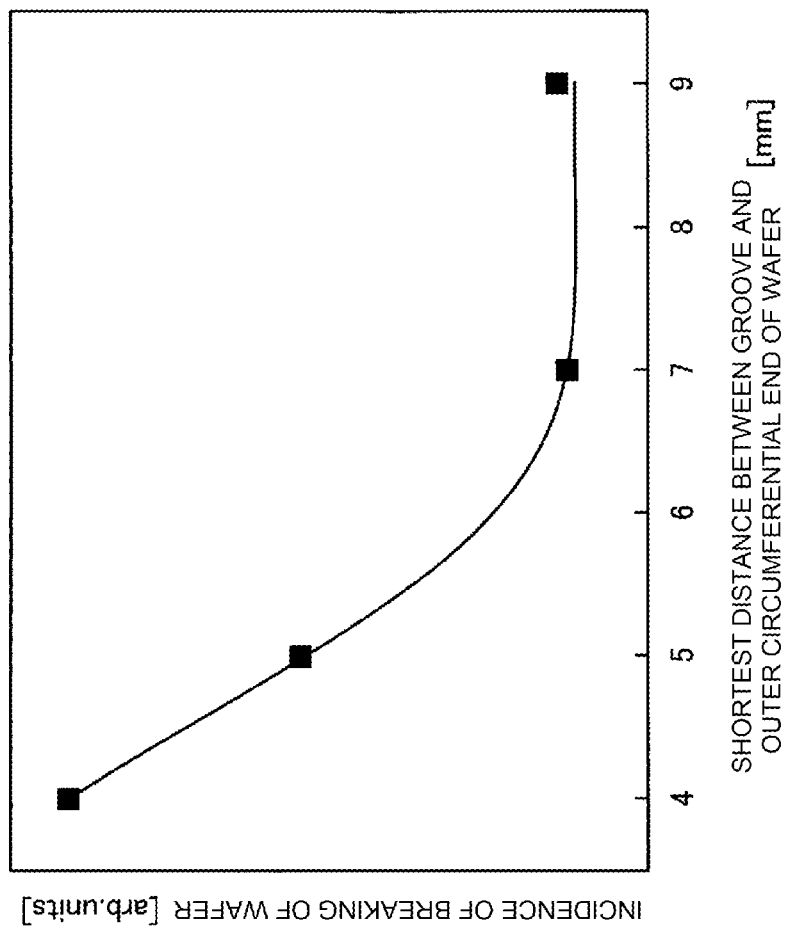
FIG. 9 is a characteristic diagram illustrating the incidence of the breaking of the wafer.

Next, the incidence of the breaking of the wafer 10 is verified. FIG. 9 is a characteristic diagram illustrating the incidence of the breaking of the wafer. The reverse blocking IGBT was manufactured on the wafer 10 according to Embodiment 1 while changing the shortest distance w11 between the groove and the outer circumferential end of the wafer to various values. The incidence of the breaking of each wafer with different shortest distances w11 between the groove and the outer circumferential end of the wafer was measured. The breakdown voltage of the reverse blocking IGBT was set to 1700 V. The thickness of the active region (which include the emitter electrode) of the reverse blocking IGBT was set to 190 μm. The thickness of the active region (which does not include the emitter electrode) of the reverse blocking IGBT was set to 180 μm. The thickness of the separation structure portion of the reverse blocking IGBT was set to 100 μm. The shortest distance w11 between the groove and the outer circumferential end of the wafer was changed in the range of 9 mm or less.

The result illustrated in FIG. 9 proved that, when the shortest distance w11 between the groove and the outer circumferential end of the wafer was equal to or more than 7 mm, the incidence of the breaking of the wafer 10 was reduced. In addition, the inventors found that the incidence of the breaking of the wafer, in which a reverse blocking IGBT with a breakdown voltage less than 1700 V was formed, was less than that of the breaking of the wafer 10 in which a reverse blocking IGBT with a breakdown voltage of 1700 V was formed. Therefore, when the setting conditions of the shortest distance w11 between the groove and the outer circumferential end of the wafer capable of reducing the incidence of the breaking of the wafer 10, in which the reverse blocking IGBT with a breakdown voltage of 1700 V is formed, are applied to the wafer in which the reverse blocking IGBT with a breakdown voltage less than 1700 V is formed, the incidence of the breaking of the wafer is also reduced. Therefore, it was verified that, when the shortest distance w11 between the groove and the outer circumferential end of the wafer was equal to or more than 7 mm, the incidence of the breaking of the wafer in which the reverse blocking IGBT with a breakdown voltage less than 1700 V was formed could be reduced.

EXAMPLE 2

Next, it was verified that, as the breakdown voltage was reduced, the incidence of the breaking of the wafer 10 was reduced. FIG. 10 is a cross-sectional view schematically illustrating the shape of the outer circumferential end of a wafer according to Example 2. The processes from a process of forming the front surface element structure of the reverse blocking IGBT on the first main surface of the wafer 10 to a process of forming the p-type collector region and the p-type layer in the second main surface of the wafer 10 were performed according to Embodiment 1. Then, the protective resist for protecting the front surface element structure on the first main surface of the wafer 10 and the resist mask for forming the grooves in the second main surface of the wafer 10 were removed. Then, the shape of the outer circumferential end 2 of the wafer 10 was observed.

Specifically, the process of forming the p-type collector region and the p-type layer in the wafer 10 was performed to prepare a wafer 10 (hereinafter, referred to as a first wafer) in which a reverse blocking IGBT with a breakdown voltage of 1200 V was formed and a wafer 10 (hereinafter, referred to as a second wafer) in which a reverse blocking IGBT with a breakdown voltage of 1700 V was formed. The first wafer was thinned and the thickness of the thinned first wafer was 190 μm. The second wafer was thinned and the thickness of the thinned second wafer was 270 μm. The shape of the outer circumferential ends 2 of the first and second wafers was observed.

Figure 10A:
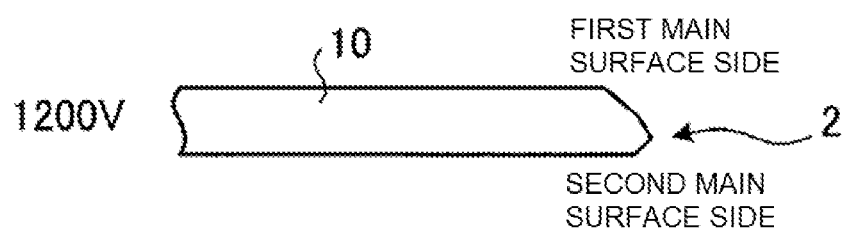
FIG. 10 is a cross-sectional view schematically illustrating the shape of an outer circumferential end of a wafer according to an example.
Figure 10B:
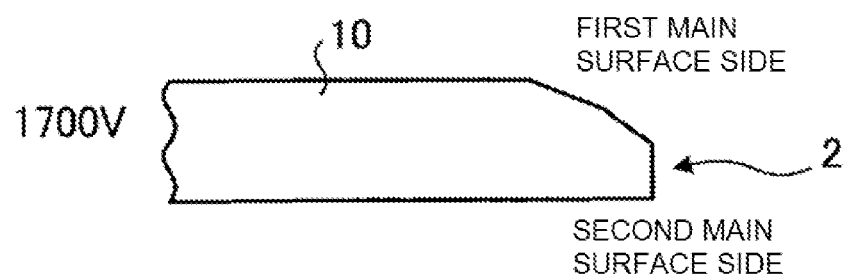

FIGS. 10(a) and 10(b) illustrate the shape of the outer circumferential ends 2 of the first and second wafers, respectively. The element structure and the grooves are formed in the first and second wafers, although not illustrated in FIGS. 10(a) and 10(b). As can be seen from FIGS. 10(a) and 10(b), the shape of the outer circumferential end 2 of the first wafer is acute, as compared to the shape of the outer circumferential end 2 of the second wafer. As such, the thickness of the first wafer is less than that of the second wafer. In addition, the shape of the outer circumferential end 2 of the first wafer is acute, as compared to the shape of the outer circumferential end 2 of the second wafer. Therefore, for example, even when the end of the wafer comes into contact with a partition portion of a wafer carrier at the time the wafer is accommodated in the wafer carrier, the first wafer is more easily deformed than the second wafer and the contact friction of the first wafer with the partition portion in the wafer carrier is less than that of the second wafer with the partition portion in the wafer carrier. Therefore, it is presumed that the incidence of the breaking of the first wafer is less than that of the breaking of the second wafer.

In addition, the thickness of the wafer in which the reverse blocking IGBT with a breakdown voltage less than 1700 V is formed, such as the first wafer, is less than that of the second wafer in which the reverse blocking IGBT with a breakdown voltage of 1700 V is formed, depending on the breakdown voltage. Therefore, the outer circumferential end 2 of the wafer in which the reverse blocking IGBT with a breakdown voltage less than 1700 V is formed, such as the first wafer, is more acute than the outer circumferential end 2 of the second wafer in which the reverse blocking IGBT with a breakdown voltage of 1700 V is formed, depending on the thickness of the wafer. Therefore, it was verified that the incidence of the breaking of the wafer in which the reverse blocking IGBT with a breakdown voltage less than 1700 V was formed was less than the incidence of the breaking of the second wafer in which the reverse blocking IGBT with a breakdown voltage of 1700 V was formed.

As described above, in the invention, the reverse blocking IGBT is given as an example. However, the invention is not limited to the above-described embodiments, but can be applied to semiconductor devices having grooves formed at the end of an element.

Industrial Applicability

As described above, the method for manufacturing the semiconductor device according to the invention is useful to manufacture power semiconductor devices which are used in an industrial field including general-purpose inverters, AC servo mechanisms, uninterruptible power supplies, or switching power supplies and a consumer equipment field including microwave ovens, rice cookers, or strobes.

The invention claimed is:

1. A method for manufacturing a semiconductor device comprising:
   forming on a first main surface of a semiconductor wafer of a first conduction type, each of
      a first electrode,
      a MOS gate structure which is a gate electrode of a semiconductor element,
      an edge termination region for forming a breakdown voltage of the semiconductor element, and
      a first semiconductor region, that is a second conduction type, surrounding the semiconductor element and the edge termination region;
   forming a groove that reaches the first semiconductor region from a second main surface of the semiconductor wafer, the groove being formed so that a portion of the semiconductor wafer, which has a predetermined width greater than zero and forms an entire outer periphery of the semiconductor wafer including an outer circumferential end of the semiconductor wafer, remains and the groove is formed inside the portion of the semiconductor wafer that forms the entire outer periphery of the semiconductor wafer so that the groove is formed further towards a center of the semiconductor wafer than the outer circumferential end;
   forming a second semiconductor region, that is the second conduction type, in direct contact with the second main surface of the semiconductor wafer;
   forming a third semiconductor region, that is the second conduction type, in direct contact with a side wall of the groove so as to be electrically connected to both of the first semiconductor region and the second semiconductor region; and
   forming a second electrode that is electrically connected to the second semiconductor region,
   wherein in the forming the groove, the groove is formed such that a corner of the groove, which is closest to the outer circumferential end of the semiconductor wafer than any other corner of the groove, has an arc shape in a plan view of the device.

2. The method for manufacturing a semiconductor device according to claim 1, wherein in the forming the groove, the groove is formed such that a distance from the side wall of the groove to the outer circumferential end of the semiconductor wafer is equal to or more than 7 mm.

3. The method for manufacturing a semiconductor device according to claim 1, wherein in a cross-sectional view of the device, the groove has a trapezoidal shape.

4. The method for manufacturing a semiconductor device according to claim 1, wherein in the forming the groove, the groove is formed such that a portion of the semiconductor wafer is disposed in a bottom of the groove.

5. The method for manufacturing a semiconductor device according to claim 1, wherein in the forming the groove, the groove is formed so as to surround the semiconductor element and the edge termination region.

6. The method for manufacturing a semiconductor device according to claim 5, wherein the semiconductor element includes a plurality of semiconductor elements,
   further wherein in the forming the groove, the groove is formed in rectangular shapes that each surrounds one of the semiconductor elements.

7. The method for manufacturing a semiconductor device according to claim 1, wherein in a cross-sectional view of the device, the groove has an arc shape.

8. The method for manufacturing a semiconductor device according to claim 1, wherein in the forming the groove, the groove is formed such that the predetermined width of the portion of the semiconductor wafer is equal to or more than 7 mm.

9. The method for manufacturing a semiconductor device according to claim 8, wherein the predetermined width is measured along a radial direction of the device.

10. The method for manufacturing a semiconductor device according to claim 1, wherein the groove is formed further towards the center of the semiconductor wafer than the outer circumferential end so that no part of the groove is at the outer circumferential end.

11. The method for manufacturing a semiconductor device according to claim 1, wherein the first main surface is opposite the second main surface.

12. The method for manufacturing a semiconductor device according to claim 1, wherein the third semiconductor region is interposed between the first semiconductor region and the groove so that no part of the first semiconductor region is in direct contact with the groove.

13. The method for manufacturing a semiconductor device according to claim 1, wherein in the forming the groove, the groove is formed such that a remaining portion of the semiconductor wafer is disposed in the groove so as to demarcate the groove into first and second trenches.

14. The method for manufacturing a semiconductor device according to claim 13, wherein in a cross-sectional view, the remaining portion is disposed in a center of the groove.

15. The method for manufacturing a semiconductor device according to claim 1, wherein a plurality of semiconductor element structures, which includes the semiconductor element, are formed on the semiconductor wafer, and the method further comprises:
dicing the wafer along the groove to separate the plurality of semiconductor element structures from each other.

16. A method for manufacturing a semiconductor device comprising:
forming on a first main surface of a semiconductor wafer of a first conduction type, each of
a first electrode,
a MOS gate structure which is a gate electrode of a semiconductor element,
an edge termination region for forming a breakdown voltage of the semiconductor element, and
a first semiconductor region, that is a second conduction type, surrounding the semiconductor element and the edge termination region;
forming a groove that reaches the first semiconductor region from a second main surface of the semiconductor wafer, the groove being formed so that a portion of the semiconductor wafer, which has a predetermined width greater than zero and forms an outer circumferential end of the semiconductor wafer, remains and the groove is formed further towards a center of the semiconductor wafer than the outer circumferential end;
forming a second semiconductor region, that is the second conduction type, in direct contact with the second main surface of the semiconductor wafer;
forming a third semiconductor region, that is the second conduction type, in direct contact with a side wall of the groove so as to be electrically connected to both of the first semiconductor region and the second semiconductor region; and
forming a second electrode that is electrically connected to the second semiconductor region,
wherein in the forming the groove, the groove is formed such that a corner of the groove, which is closest to the outer circumferential end of the semiconductor wafer than any other corner of the groove, is chamfered in a plan view of the device.

17. The method for manufacturing a semiconductor device according to claim 16, wherein in the forming a groove,
the groove is formed so that the portion of the semiconductor wafer forms an entire outer periphery of the semiconductor wafer including the outer circumferential end of the semiconductor wafer, and
the groove is further formed inside the portion of the semiconductor wafer that forms the entire outer periphery of the semiconductor wafer so that the groove is formed further towards the center of the semiconductor wafer than the outer circumferential end.

18. A method for manufacturing a semiconductor device comprising:
forming on a first main surface of a semiconductor wafer of a first conduction type, each of
an edge termination region for forming a breakdown voltage of a semiconductor element, and
a first semiconductor region, that is a second conduction type, surrounding the semiconductor element and the edge termination region;
forming a groove that reaches the first semiconductor region from a second main surface of the semiconductor wafer, the groove being formed so that a portion of the semiconductor wafer, which has a predetermined width greater than zero and forms an entire outer periphery of the semiconductor wafer including an outer circumferential end of the semiconductor wafer, remains and the groove is formed inside the portion of the semiconductor wafer that forms the entire outer periphery of the semiconductor wafer so that the groove is formed further towards a center of the semiconductor wafer than the outer circumferential end;
forming a second semiconductor region, that is the second conduction type, in direct contact with the second main surface of the semiconductor wafer; and
forming a third semiconductor region, that is the second conduction type, in direct contact with a side wall of the groove so as to be electrically connected to both of the first semiconductor region and the second semiconductor region,
wherein in the forming the groove, the groove is formed such that a corner of the groove, which is closest to the outer circumferential end of the semiconductor wafer than any other corner of the groove, has an arc shape in a plan view of the device.

19. The method for manufacturing a semiconductor device according to claim 18, wherein the third semiconductor region is interposed between the first semiconductor region and the groove so that no part of the first semiconductor region is in direct contact with the groove.

20. The method for manufacturing a semiconductor device according to claim 18, wherein in the forming the groove, the groove is formed such that a remaining portion of the semiconductor wafer is disposed in the groove so as to demarcate the groove into first and second trenches.

21. The method for manufacturing a semiconductor device according to claim 18, wherein a plurality of semiconductor element structures, which includes the semiconductor element, are formed on the semiconductor wafer, and the method further comprises:
dicing the wafer along the groove to separate the plurality of semiconductor element structures from each other.

\* \* \* \* \*